(12) United States Patent
Chang et al.

(10) Patent No.: US 10,431,679 B2
(45) Date of Patent: Oct. 1, 2019

(54) SEMICONDUCTOR DEVICE AND METHOD FOR FORMING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Yu-Cheng Tung, Kaohsiung (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/942,568

(22) Filed: Apr. 1, 2018

(65) Prior Publication Data
US 2018/0342613 A1     Nov. 29, 2018

(30) Foreign Application Priority Data

May 26, 2017 (CN) .......................... 2017 1 0385077

(51) Int. Cl.
| H01L 29/00 | (2006.01) |
| H01L 29/78 | (2006.01) |
| H01L 21/4757 | (2006.01) |
| H01L 21/02 | (2006.01) |
| H01L 21/762 | (2006.01) |
| H01L 27/108 | (2006.01) |

(Continued)

(52) U.S. Cl.
CPC ...... *H01L 29/7825* (2013.01); *H01L 21/0229* (2013.01); *H01L 21/47573* (2013.01); *H01L 21/76224* (2013.01); *H01L 27/10876* (2013.01); *H01L 27/10891* (2013.01); *H01L 29/4236* (2013.01); *H01L 29/66734* (2013.01); *H01L 29/7813* (2013.01); *H01L 2221/1057* (2013.01)

(58) Field of Classification Search
CPC ............. H01L 29/4236; H01L 29/7813; H01L 29/66734; H01L 29/7825
See application file for complete search history.

(56) References Cited

U.S. PATENT DOCUMENTS 8,008,144 B2 * 8/2011 Ananthan ......... H01L 29/42376
257/310
9,281,368 B1 * 3/2016 Lee .................... H01L 29/66484
(Continued)

OTHER PUBLICATIONS

Chang, Title of Invention: Semiconductor Device and Method for Fabricating the Same, U.S. Appl. No. 15/611,759, filed Jun. 1, 2017.
(Continued)

*Primary Examiner* — Nicholas J Tobergte
(74) *Attorney, Agent, or Firm* — Winston Hsu (57) ABSTRACT

A semiconductor structure and a method for forming the same are provided. The semiconductor structure includes a substrate and at least a gate trench extending along a first direction formed in the substrate. A gate dielectric layer is formed conformally covering the gate trench. A gate metal is formed on the gate dielectric layer and filling the gate trench. A plurality of intervening structures are arranged along the first direction in a lower portion of the gate trench and disposed between the gate metal and the gate dielectric layer.

8 Claims, 14 Drawing Sheets

(51) Int. Cl.
  *H01L 29/66*  (2006.01)
  *H01L 29/423*  (2006.01)

(56) References Cited

U.S. PATENT DOCUMENTS

| | | | | |
|---|---|---|---|---|
| 9,508,847 B2* | 11/2016 | Oh | .................... | H01L 29/7827 |
| 10,043,811 B1* | 8/2018 | Tsai | .................. | H01L 27/10876 |
| 2012/0086074 A1* | 4/2012 | Hwang | ............. | H01L 27/10876 |
| | | | | 257/334 |
| 2015/0349073 A1* | 12/2015 | Kang | .................. | H01L 29/4236 |
| | | | | 257/330 |
| 2016/0099325 A1* | 4/2016 | Calafut | ............. | H01L 29/42368 |
| | | | | 257/331 |
| 2016/0172488 A1* | 6/2016 | Oh | .................... | H01L 29/7827 |
| | | | | 257/330 |
| 2016/0233220 A1* | 8/2016 | Danek | ............... | H01L 27/10891 |

OTHER PUBLICATIONS

Tsai, Title of Invention: Semiconductor Structure for Preventing Row Hammering Issue in DRAM Cell and Method for Manufacturing the Same, U.S. Appl. No. 15/627,455, filed Jun. 20, 2017.
Yang, Title: Suppression of Row Hammer Effect by Doping Profile Modification in Saddle-Fin Array Devices for sub-30-nm DRAM Technology; IEEE Transactions on Device and Materials Reliability ( vol. 16, Issue: 4, Dec. 2016 ), Sep. 9, 2016.

* cited by examiner

SEMICONDUCTOR DEVICE AND METHOD FOR FORMING THE SAME

BACKGROUND OF THE INVENTION

1. Field of the Invention

The present invention generally relates to a semiconductor structure and a method for forming the same. More particularly, the present invention relates to a dynamic random access memory (DRAM) and a method for forming the same.

2. Description of the Prior Art

A dynamic random access memory (DRAM) is one kind of volatile memory. A DRAM usually includes an array region including a plurality of memory cells and a peripheral region including control circuits. Typically, a memory cell includes one transistor and one capacitor electrically coupled to the transistor, which is known as a 1T1C cell. A digital data is stored in a memory cell by controlling the transistor to charge or discharge the capacitor. The control circuits in the peripheral region may address each of the memory cells in the array region by plural columns of word lines and plural rows of bit lines traversing the array region and electrically connected to each of the memory cells to perform reading, writing or erasing data.

In advanced technology, by adopting three-dimensional structure, the size of the memory cells of a DRAM may be greatly miniaturized and a higher integrity may be achieved. Buried word line structures have been proposed and widely used in the field in which control gates of the transistors and the word line for accessing the transistors are formed integrally as a buried word line buried in a gate trench cutting through the active regions of the transistors. The buried word line intersects the active region to form an active gate region (a trenched gate) which controls the conductance of the overlapping active region (channel region of the transistor). Another portion of the buried word line intersecting the isolation structure surrounding the active regions, especially the isolation structure between adjacent terminals of active regions is considered as a passing gate (PG) region. An additional advantage of adopting buried word line structure is that, the leakage current resulting from the short channel effect as the shrinkage of memory cells in size may be significantly reduced.

However, some troublesome problems existing in DRAM device may be worsen regarding buried word line structures. For example, the row hammer effect is an unintended side effect in dynamic random-access memory (DRAM) having a buried word line structure. The raw hammer effect may cause memory cells to leak their charges and possibly alternate the contents of nearby memory rows that were not addressed in the original memory access. A possible root cause of raw hammer effect is that when a bias is applied to a selected column of buried wordline, parasitic electrons may accumulate in the active regions adjacent to the sidewalls of the passing gate regions along the selected buried word line. The accumulated parasitic electrons may drift to the adjacent storage node contact region or bypass the gate region of a non-selected neighboring word line and drift to the bit line contact region and causing data corruption in adjacent rows. The row hammer effect has become more serious as the dimension of the DRAM memory cells continues to shrink.

SUMMARY OF THE INVENTION

One objective of the present invention is to provide a semiconductor structure and a method for forming the same. The semiconductor structure according to the present invention may prevent row hammer effect by forming a plurality of intervening structures arranged along the buried word line and respectively under the passing gate region of the buried wordline. The parasitic electrons accumulated near the passing gate region may be reduced and the opportunity for the parasitic electrons to bypass an adjacent word line and drift to the bit line contact may be prevented.

To achieve the objective, a semiconductor structure is provided. According to an embodiment, the semiconductor structure includes a substrate, at least a gate trench extending along a first direction formed in the substrate, a gate dielectric layer conformally covering the gate trench, a gate metal formed on the gate dielectric layer and filling up the gate trench, and a plurality of intervening structures arranged along the first direction in a lower portion of the gate trench and disposed between the gate metal and the gate dielectric layer.

To achieve the objective, a method of forming a semiconductor structure is provided. According to an embodiment, the method includes the following steps. A substrate is provided. At least a gate trench extending along a first direction is formed in the substrate. A gate dielectric layer is formed conformally covering the gate trench. A sacrificial layer is formed on the gate dielectric layer and completely filling the gate trench. A plurality of openings is formed through the sacrificial layer in the gate trench thereby exposing a portion of the gate dielectric layer. A dielectric material is formed in the opening and an etching back process is then performed to remove a portion of the dielectric material until the dielectric material only remains at a lower portion of each of the openings thereby obtaining a plurality of intervening structures. Afterward, the sacrificial layer is removed and a gate metal is formed filling the gate trench, wherein the intervening structures are disposed between the gate metal and the gate dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

FIG. 1 to FIG. 9 are schematic diagrams illustrating the process of forming a semiconductor structure according to a preferred embodiment of the present invention. The semiconductor structure 1 in the preferred embodiment may be a dynamic random access memory (DRAM) device having buried word lines. In FIGS. 1, 3, 4 and 7, the upper portions are top views of the semiconductor structure 1 in different process steps. The lower-left portions and lower-right portions are cross-sectional views taken along line A-A' and line B-B' in the top views. It is noteworthy that line A-A' and line B-B' intersect at a region between adjacent terminals 10c of active regions 10a along line A-A', which is substantially the passing gate (PG) region of a buried word line formed in the gate trench 12 along line B-B. For the sake of simplicity, FIGS. 2, 5, 6, 8 and 9 only shows cross-sectional views taken along line A-A' and line B-B'. In the following description, the extending direction of line B-B' is defined as the first direction, and the extending direction of line A-A' is defined as the second direction.

Figure 1:
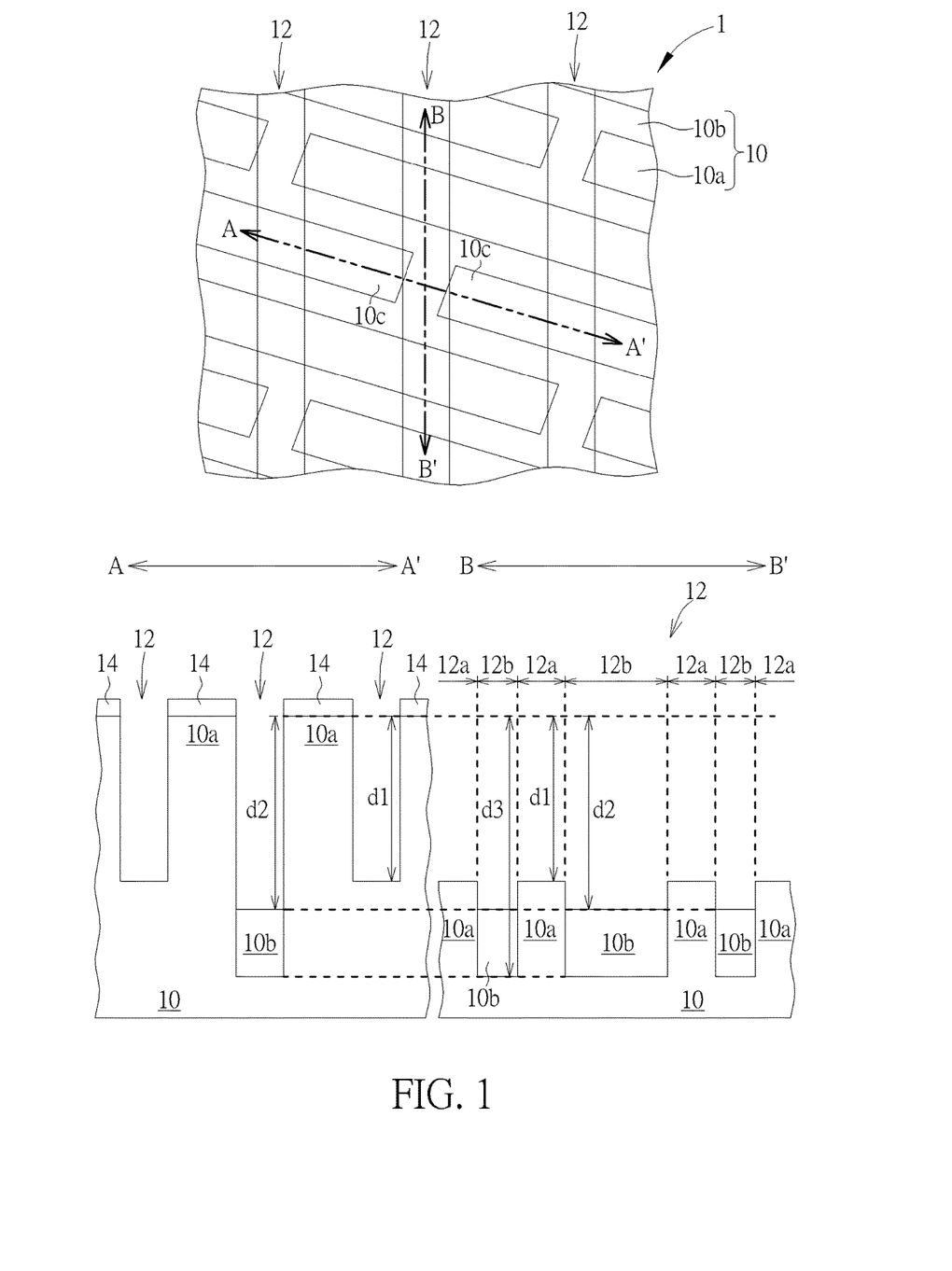
FIG. 1 to FIG. 9 are schematic diagrams illustrating the process of forming a semiconductor structure according to a preferred embodiment of the present invention.

Please refer to FIG. 1. A substrate 10 is provided. The substrate 10 may be a silicon substrate or silicon on insulator (SOI) substrate, but not limited hereto. An isolation structure 10b is formed in the substrate 10 to define a plurality of active regions 10a in the substrate 10. The active regions 10a extend along a second direction (the extending direction of line A-A') and are arranged end-to-end along the second direction. The isolation structure 10b may be a shallow trench isolation (STI) structure. According to an embodiment, the isolation structure 10b may be formed by forming a patterned mask layer (not shown) on the substrate 10 and etching the substrate 10 using the patterned mask as an etching mask to form an isolation trench in the substrate and defining the active regions 10a. A dielectric material such as silicon oxide is then formed completely covering the substrate 10 and filling up the isolation trench. The excess dielectric material outside the isolation trench may be removed by performing an etching back process or planarization process, and the dielectric material remaining in the isolation trench becomes the isolation structure 10b for electrically isolating the active regions 10a. Preferably, a hard mask layer 14 may be formed between the substrate 10 and the patterned mask layer (not shown). The pattern of the patterned mask layer may be transferred to the hard mask layer 14 by etching the hard mask 14 using the patterned mask layer (not shown) as an etching mask. The pattern is then transferred to the substrate 10 by etching the substrate 10 using the hard mask layer 14 as an etching mask. After the isolation structure 10b and the active regions 10a have been formed in the substrate 10, another patterning process may be carried out to form a plurality of gate trenches 12 in the substrate 10. Each of the gate trenches 12 extends along a first direction (the extending direction of line B-B') and intersects the active regions 10a and the isolation structure 10b along the first direction. Please see the cross-sectional views shown in the lower-left portion of FIG. 1. It should be noticed that the current embodiment illustrates a critical case when the distance between adjacent terminals 10c of active regions 10a along the line A-A' is very small and the gate trenches 12 are very likely to reach the terminals 10c of active regions 10a, and therefore exposing the sidewalls of the terminals 10c. In other embodiments when the gate trench 12 may just pass through the adjacent terminals 10c of active regions 10a but not expose the sidewalls of the terminals 10c, there may exist a layer of the isolation structure 10b between the gate trench 12 and the sidewalls of the terminals 10c. Because the active regions 10a and the isolation structure 10b comprise different materials (for example, silicon verses silicon oxide), they may have different etching rate in the step of forming the gate trenches 12. Consequently, different regions of the gate trenches 12 intersecting the active region 10a and the isolation structure 10b may have different depths. As shown in the lower-right portion of FIG. 1, along the extending direction of a gate trench 12, it may include a plurality of first regions 12a and a plurality of second regions 12b arranged alternatingly. More particularly, the first regions 12a are where the gate trench 12 intersects the active regions 10a and have a depth d1. The second regions 12b are where the gate trench 12 intersects the isolation structure 10b and have a depth d2. The depth d1 is smaller than the depth d2. It should be noticed that the isolation structure 10b has a depth d3, and d3 is larger than d1 and d2.

Figure 2:
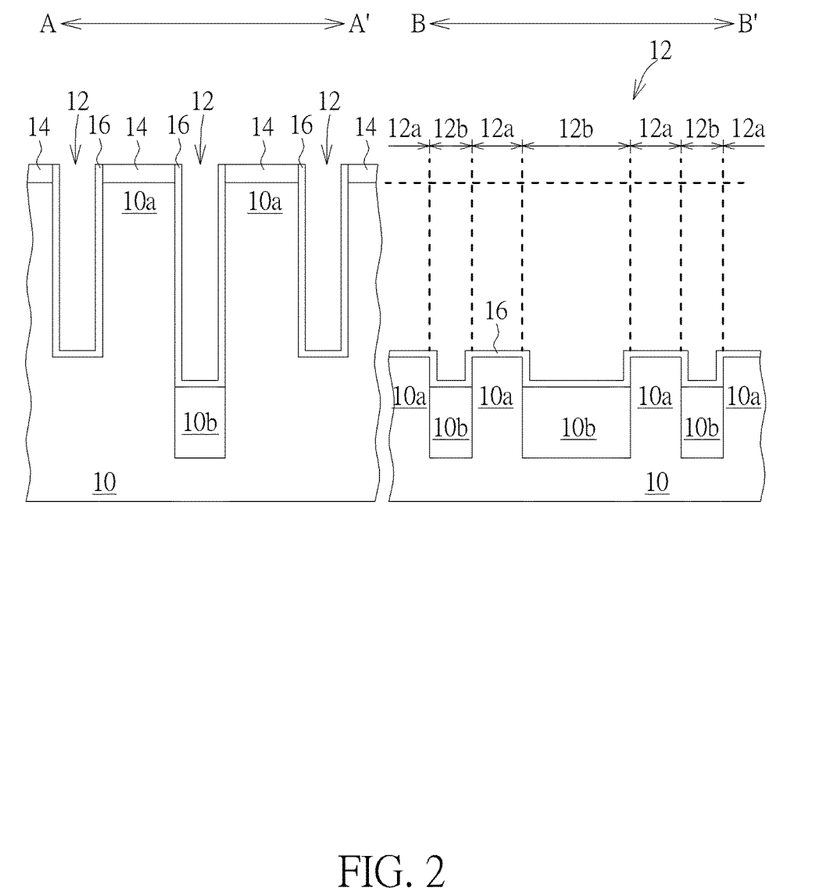

Please refer to FIG. 2. Afterward, a gate dielectric layer 16 is formed conformally covering the gate trench 12 along the sidewall and the bottom surface of the gate trench 12. The gate dielectric layer 16 may comprise dielectric material such as silicon oxide, silicon nitride or high-k dielectric materials, but not limited hereto. The gate dielectric layer 16 may be formed by an atomic layer deposition (ALD) process or an in-situ steam generation (ISSG) process.

Figure 3:
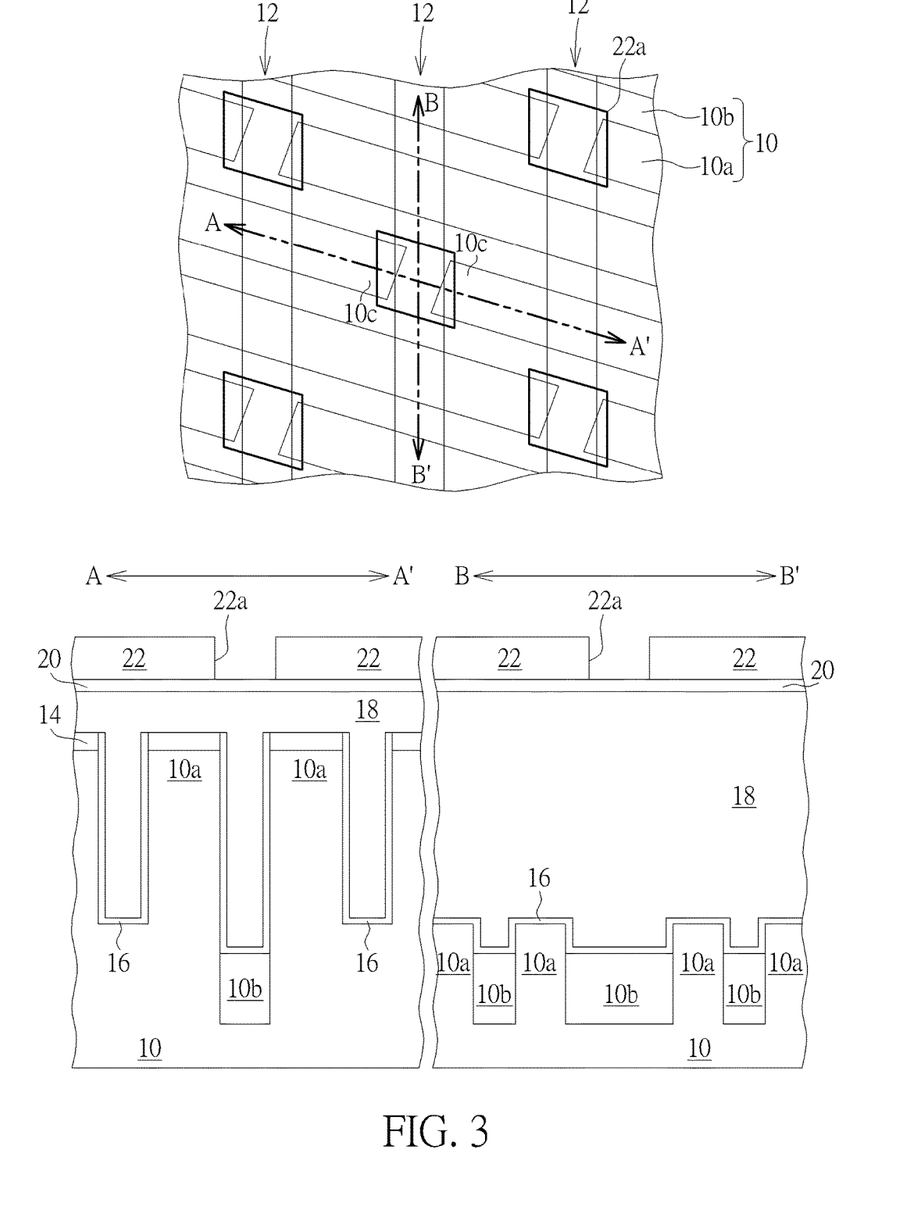

Please refer to FIG. 3. A sacrificial layer 18 is then formed completely covering the substrate 10 and filling up the gate trenches 12. After that, a patterned mask layer 22 is formed on the sacrificial layer 18. The patterned mask layer 22 comprises a plurality of openings 22a respectively aligned with one of the passing gate (PG) regions between adjacent terminals 10c of active regions 10a along the second direction. The sacrificial layer 18 may comprise, for example, spin-on glass, bottom anti-reflective coating (BARC) or organic materials such as photoresist materials. Preferably, an anti-reflective coating layer 20 may be formed between the patterned mask layer 22 and the sacrificial layer 18. As shown in FIG. 3, each of the openings 22a may have a width along the second direction (along line A-A') equal to or wider than the width of the gate trench 12 and the distance between adjacent terminals 10c of the active regions 10a, and may have a length along the first direction (along line B-B') larger than a width of the active regions 10a but smaller than the distance between the active regions 10a at two sides of the passing gate region along the first direction.

Figure 4:
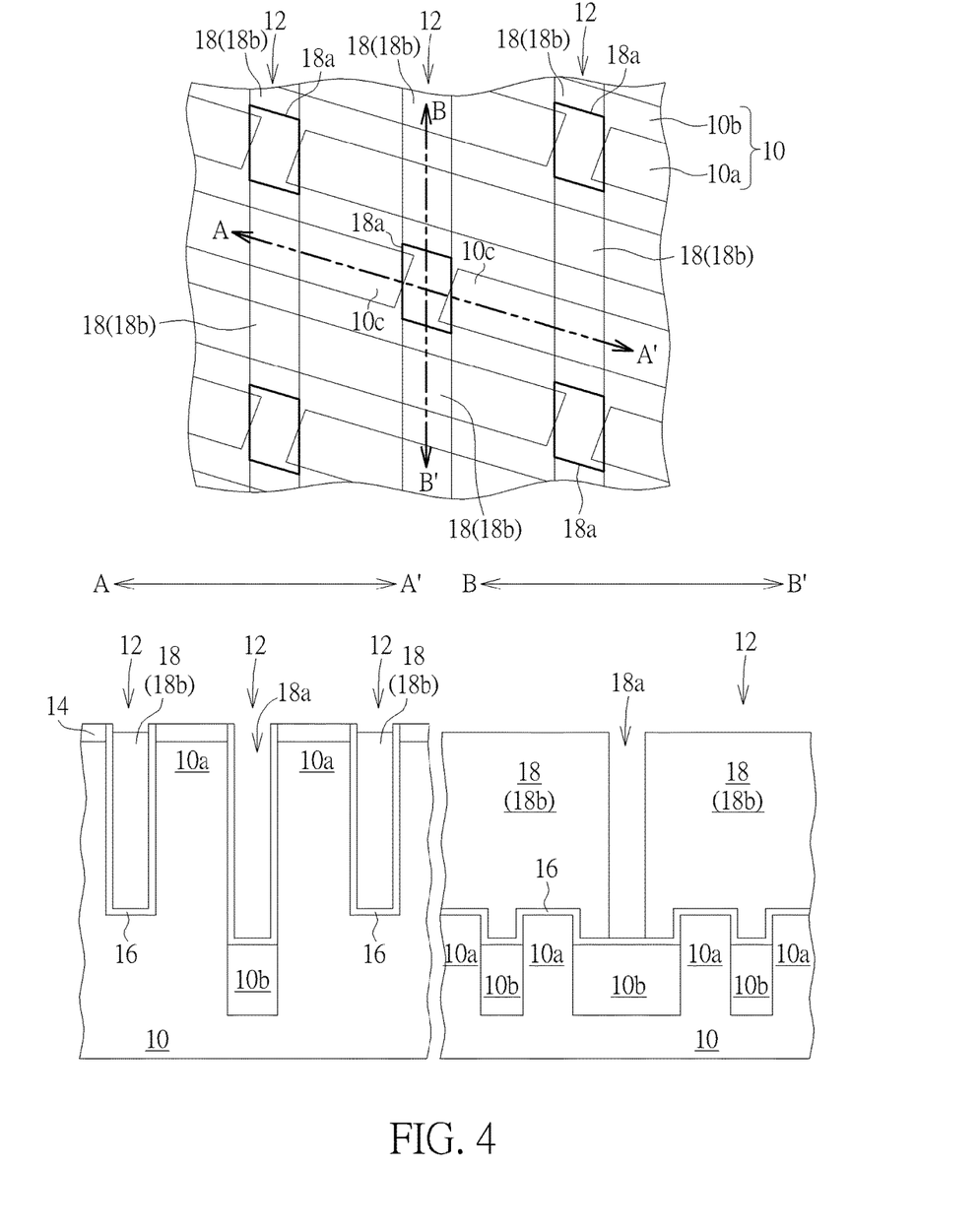

Please refer to FIG. 4. Subsequently, an etching process is performed, using the patterned mask 22 as an etching mask to remove a portion of the anti-reflective coating layer 20 and the sacrificial layer 18 thereby extending the openings 22a downwardly through the anti-reflective coating layer 20 and into the sacrificial layer 18 filling in the gate trenches 12 until exposing the gate dielectric layer 16 covering the bottom surface of the gate trenches 12. Afterward, the patterned mask 22, the anti-reflective coating layer 20 and the portion of the sacrificial layer 18 outside the gate trenches 12 are removed, leaving the sacrificial layer 18 only filling in each gate trench 12 and being divided into a plurality of discrete segments 18b by a plurality of openings 18a arranged along the first direction in each gate trenches 12. As previously mentioned, each of the openings 22a may have a width along the second direction (along line A-A') equal to or wider than the width of the gate trench 12 and the distance between adjacent terminals 10c of the active regions 10a, and may have a length along the first direction (along line B-B') larger than a width of the active regions 10a but smaller than the distance between the active regions 10a at two sides of the passing gate region along the first direction. Therefore, each of the openings 18a may have a width substantially defined by the width of the gate trench 12 and a length substantially defined by the length of the associated opening 22a in the patterned mask layer 22. According to the embodiment, as shown in the top view shown in the upper portion of FIG. 4, the segments 18b of the sacrificial layer 18 remaining in the trenches 12 may have distal ends overlapping on the isolation structure 10b. The openings 18a are enclosed patterns defined by opposite sidewalls of the gate trenches 12 and opposite sidewalls of adjacent segments 18b. As shown in lower-left portion of FIG. 4, the gate dielectric layer 16 covering on the sidewalls of adjacent terminals 10c of active regions 10a are exposed from the openings 18a. As shown in lower-right portion of FIG. 4, the lengthwise sidewalls of the active regions intersected by the gate trench 12 is covered by the segments 18b of the sacrificial layer 18 and are not exposed. The sacrificial layer 18 remaining in the gate trenches 12 may have a top surface slight lower than the upper surface of the hard mask layer 14 or the upper surface of the active regions 10a when hard mask layer 14 is omitted.

Figure 5:
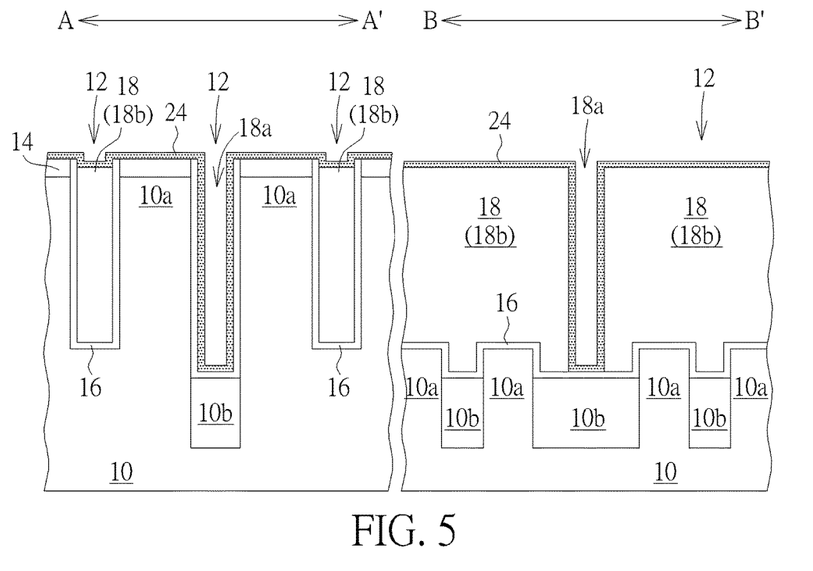

Please refer to FIG. 5. Subsequently, a dielectric material 24 is formed conformally covering the substrate 10 and the sacrificial layer 18 and covering along the sidewall and bottom surface of the openings 18a. The dielectric material 24 may comprise dielectric material such as silicon oxide, silicon nitride, silicon oxynitride or other suitable dielectric materials. Preferably, the dielectric material 24 is formed by an atomic layer deposition (ALD) process.

Figure 6:
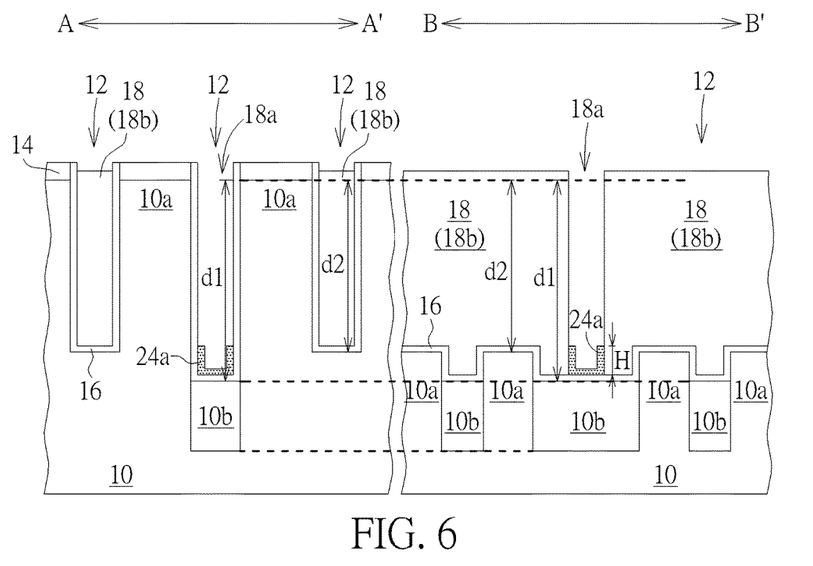

Please refer to FIG. 6. Subsequently, an etching back process is performed to remove a portion of the dielectric material 24 until the remaining dielectric material 24 only disposed in a lower portions of each of the openings 18a, thereby forming a plurality of intervening structures 24a.

Figure 7:
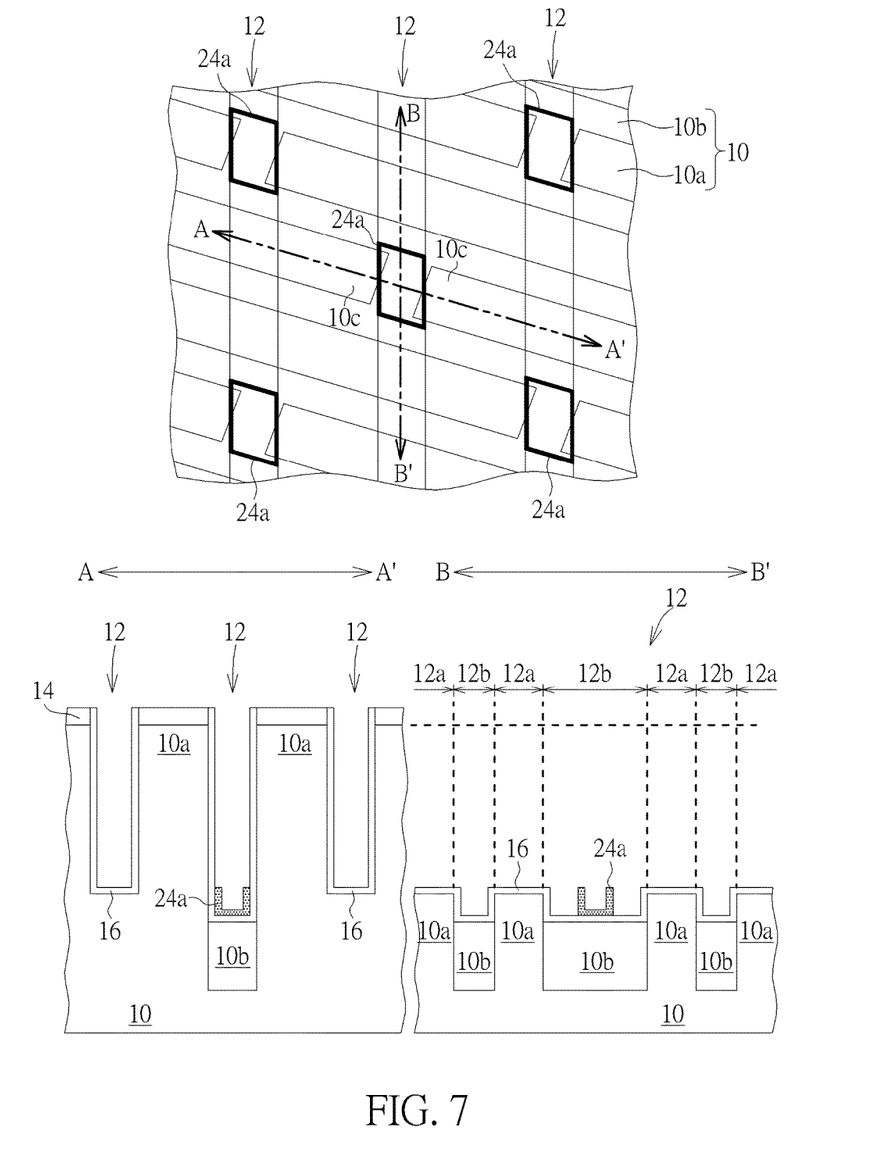

Please refer to FIG. 7. After that, the sacrificial layer 18a is completely removed, leaving the intervening structures 24a arranged along the first direction in a lower portion of each gate trench 12. The position of respective intervening structure 24a is defined by the position of the associated opening 18a. That is, each intervening structure 24a is positioned between adjacent terminals 10c of active regions 10a along the second direction. As shown in FIG. 7, each of the intervening structures 24a has a bottom portion and a side portion extending upwardly from the bottom portion to form a cup-shaped structure having a U shaped cross-sectional profile. Please refer to lower-left portion of FIG. 7. The intervening structure 24a is in direct contact with the gate dielectric layer 16, and the side portion of the intervening structure 24 overlaps the sidewalls of the terminals 10c in a lower portion of the gate trench 12. The height (or thickness) H of the intervening structure 24a is preferably equal to or slightly larger than d2−d1. In an alternative embodiment, when etching back the dielectric material 24, the portion of the dielectric material 24 covering the bottom surface of the openings 18a may be removed, and therefore the intervening structures may be formed having a hollow pillar shape (not shown).

Figure 8:
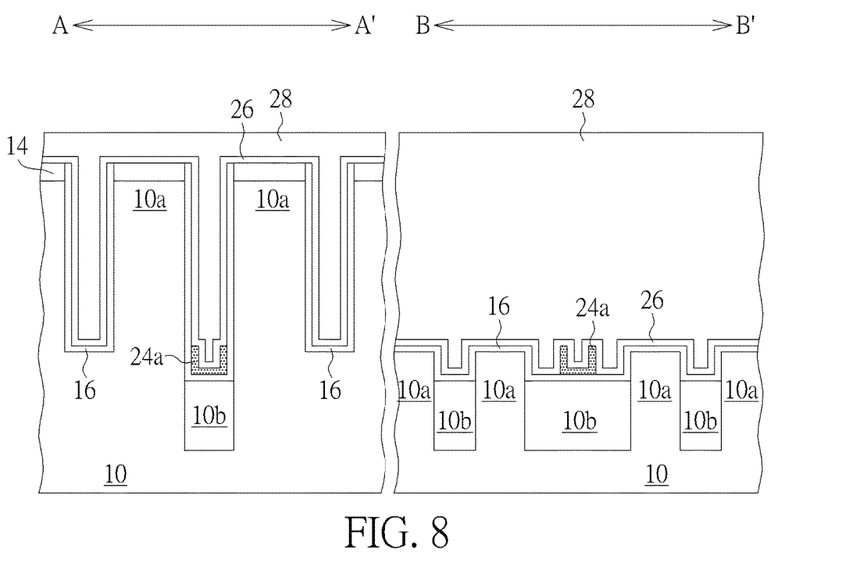

Please refer to FIG. 8. After forming the intervening structures 24a, a barrier layer 26 may be formed conformally covering the substrate 10, the gate trenches 12 and the intervening structures 24a arranged in the gate trenches 12. A gate metal 28 is then formed on the barrier layer 26 and completely filling up the gate trenches 12. The barrier layer 26 may include conventional barrier layer material such as Ti, TiN, Ta, TaN, TiW, or the combination thereof, but not limited hereto. The gate metal 28 may include conductive materials such as Ti, W, Al, Cu, Au, work function metals, low resistance metals, or the combination thereof, but not limited hereto. Optionally, the gate dielectric layer 16 not covered by the intervening structure 24a may be removed and another gate dielectric layer (not shown) may be formed before forming the barrier layer 26.

Figure 9:
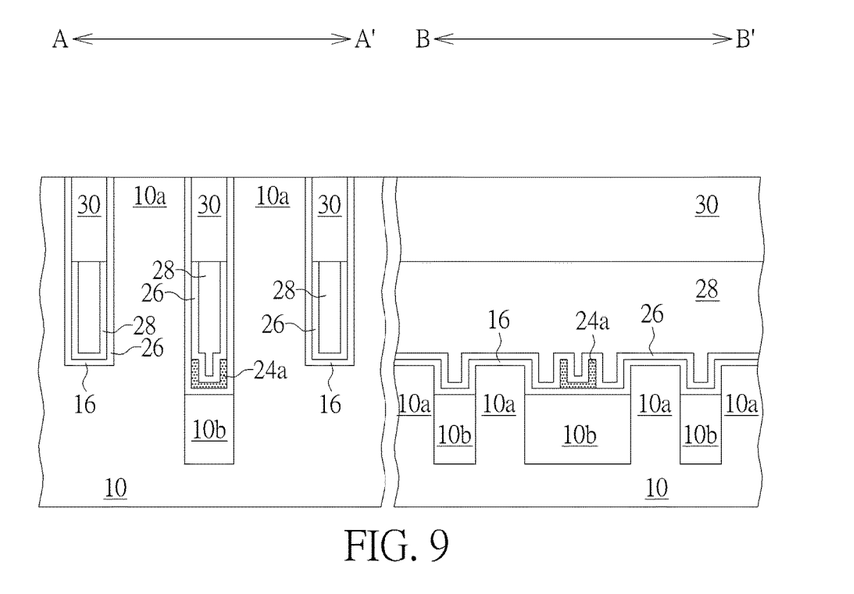

Please refer to FIG. 9. A planarization process or an etching back process is then performed to remove the excess gate metal 28 and the barrier layer 26 outside the gate trenches 12. After that, the gate metal 28 and the barrier layer 26 remaining in the gate trenches 12 are further recessed to a predetermined level lower than the top surface of the active region 10a. An insulating material (not shown) is then deposited on the substrate 12, covering the gate metal 28 and the barrier layer 26 and completely filling the gate trenches 12. After removing the insulating material outside the gate trenches 12 by performing another planarization process or etching back process, the remaining insulating material in the gate trenches 12 becomes the cap layer 30 filling an upper portion of each gate trench 12, as shown in FIG. 9. To this point, the buried word lines according to the invention are obtained. The hard mask layer 14 on the active regions 10a may act as a polishing stop layer or etching stop layer during the planarization process or etching back process for removing the excess gate metal 28 and barrier layer 26. In a preferred embodiment, at least a portion of the hard mask layer 14 may remain on the active regions 10a after removing the excess gate metal 28 and barrier layer 26 and act as a polishing stop layer or etching stop layer again during the planarization process or etching back process for removing the excess insulating material outside the gate trenches 12 when forming the cap layer 30. The intervening structures 24a are disposed in the passing gate regions of each buried word line along the extending direction of the buried word line and sandwiched between the gate metal 28 and the gate dielectric layer 16.

Figure 10:
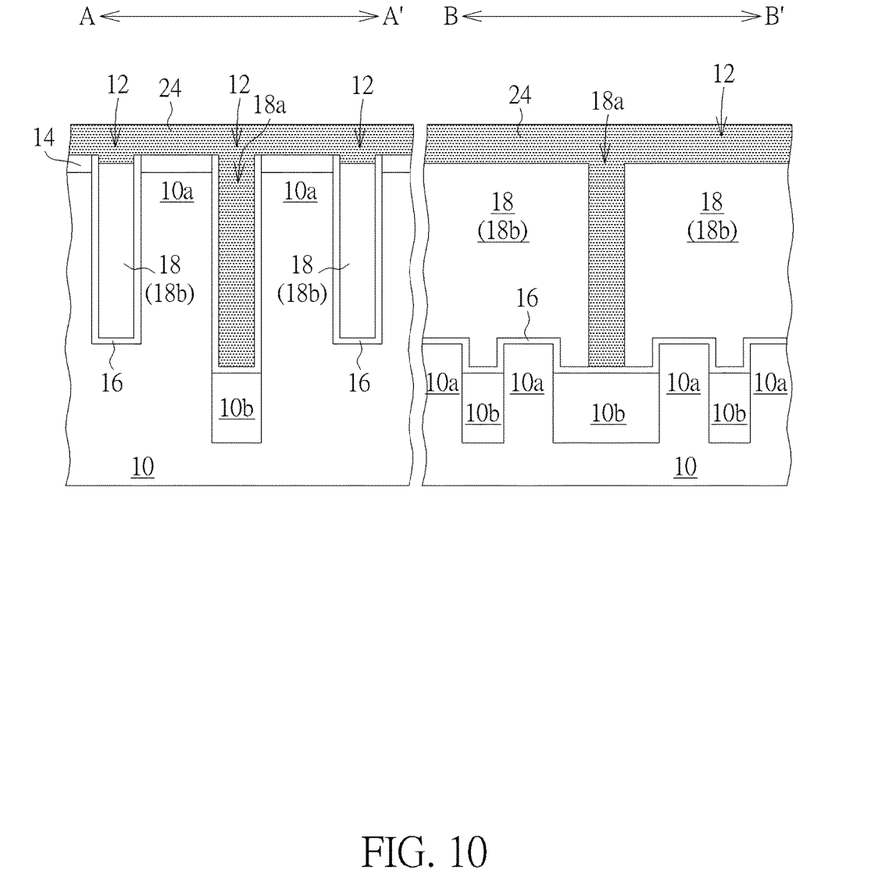
FIG. 10 and FIG. 11 are schematic diagrams illustrating a first modification of the preferred embodiment.
Figure 11:
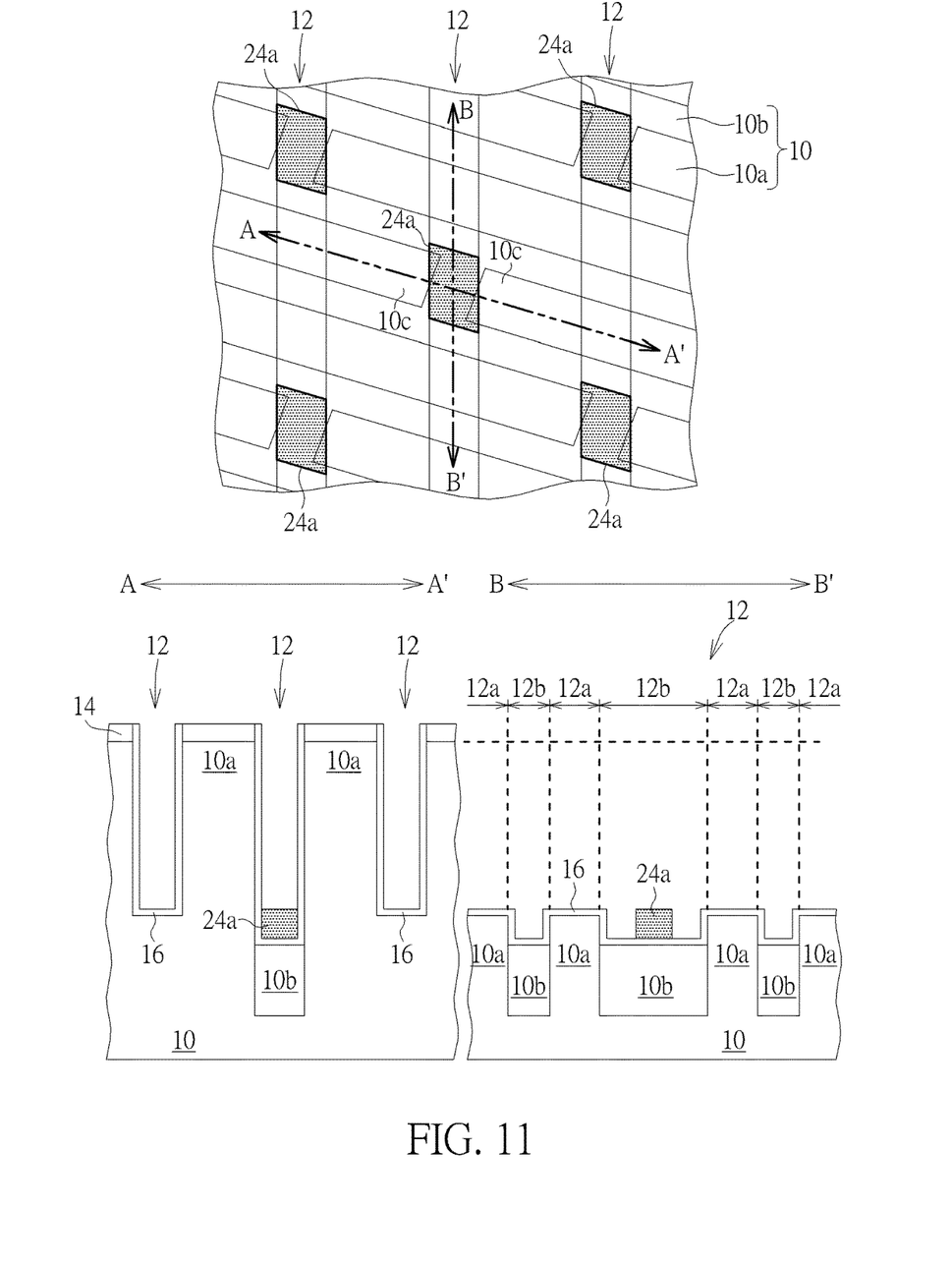

FIG. 10 and FIG. 11 show a first modification of the preferred embodiment illustrated in FIG. 1 to FIG. 9 regarding the way of the dielectric material 24 filling in the openings 18a. The step shown in FIG. 10 corresponds to the step shown in FIG. 5, and the step shown in FIG. 11 corresponds to the step shown in FIG. 7. Other steps of the first modification are substantially the same as illustrated in previous passages. Please refer to FIG. 10. In the first modification, different from FIG. 5, the dielectric material 24 is formed completely filling the openings 18a. Accordingly, as shown in FIG. 11, after etching back the dielectric material 24, the obtained intervening structure 24a may have a shape of solid pillar.

Figure 12:
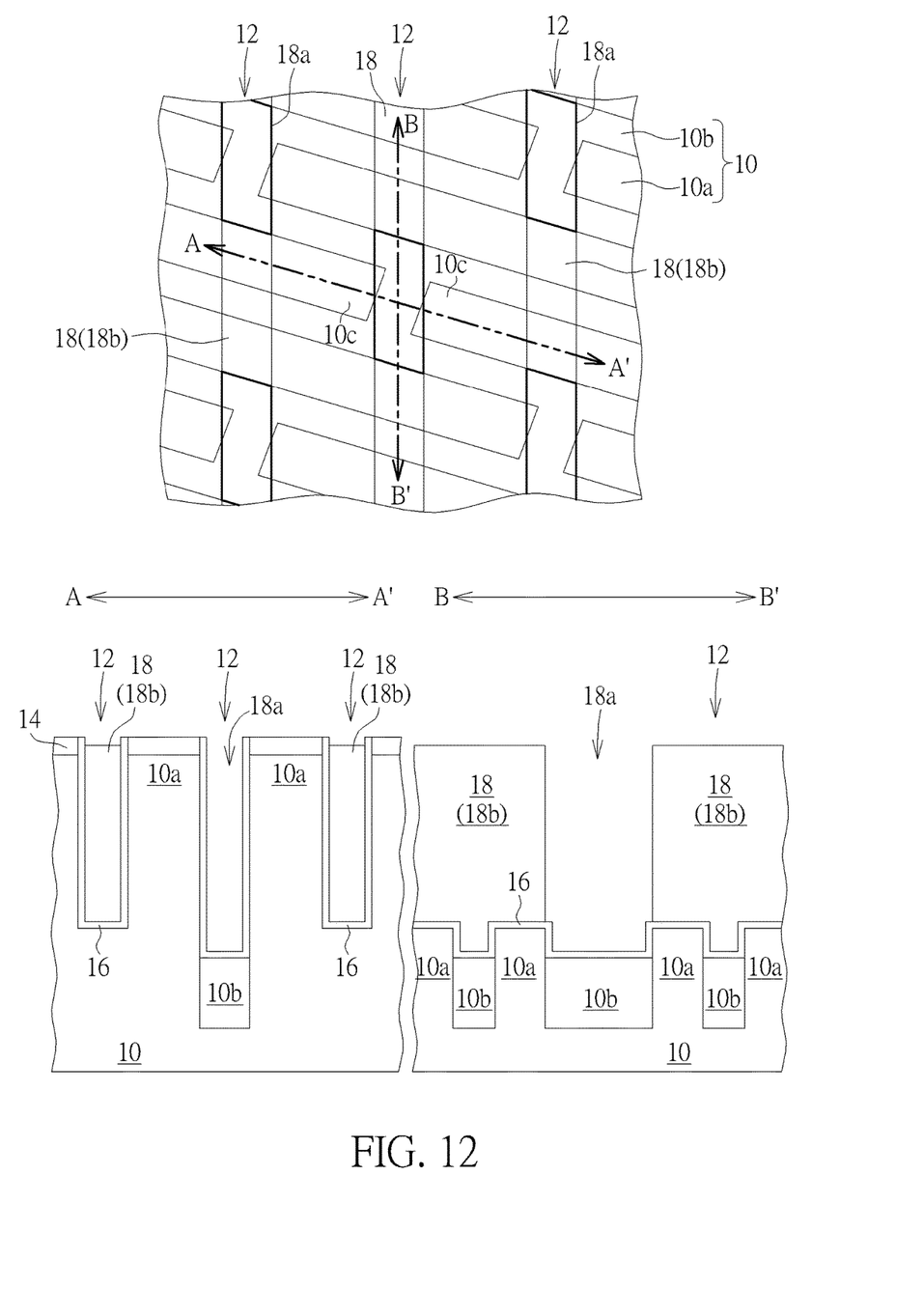
FIG. 12 to FIG. 14 are schematic diagrams illustrating a second modification of the preferred embodiment.
Figure 13:
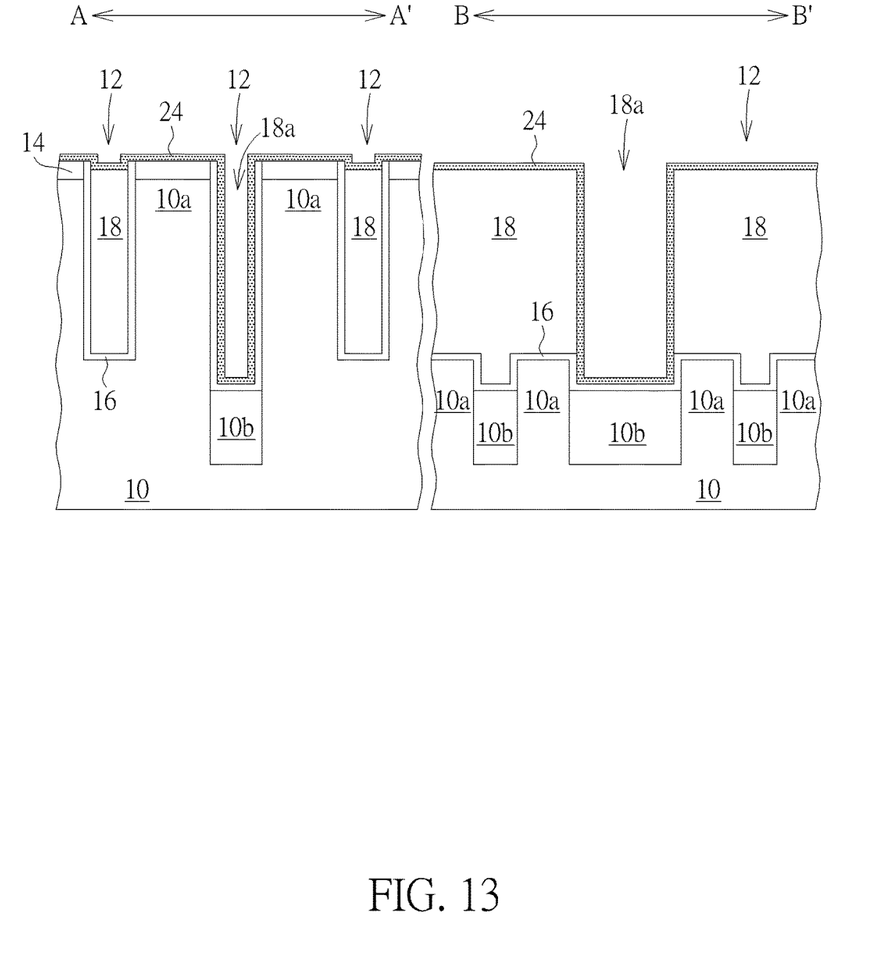
Figure 14:
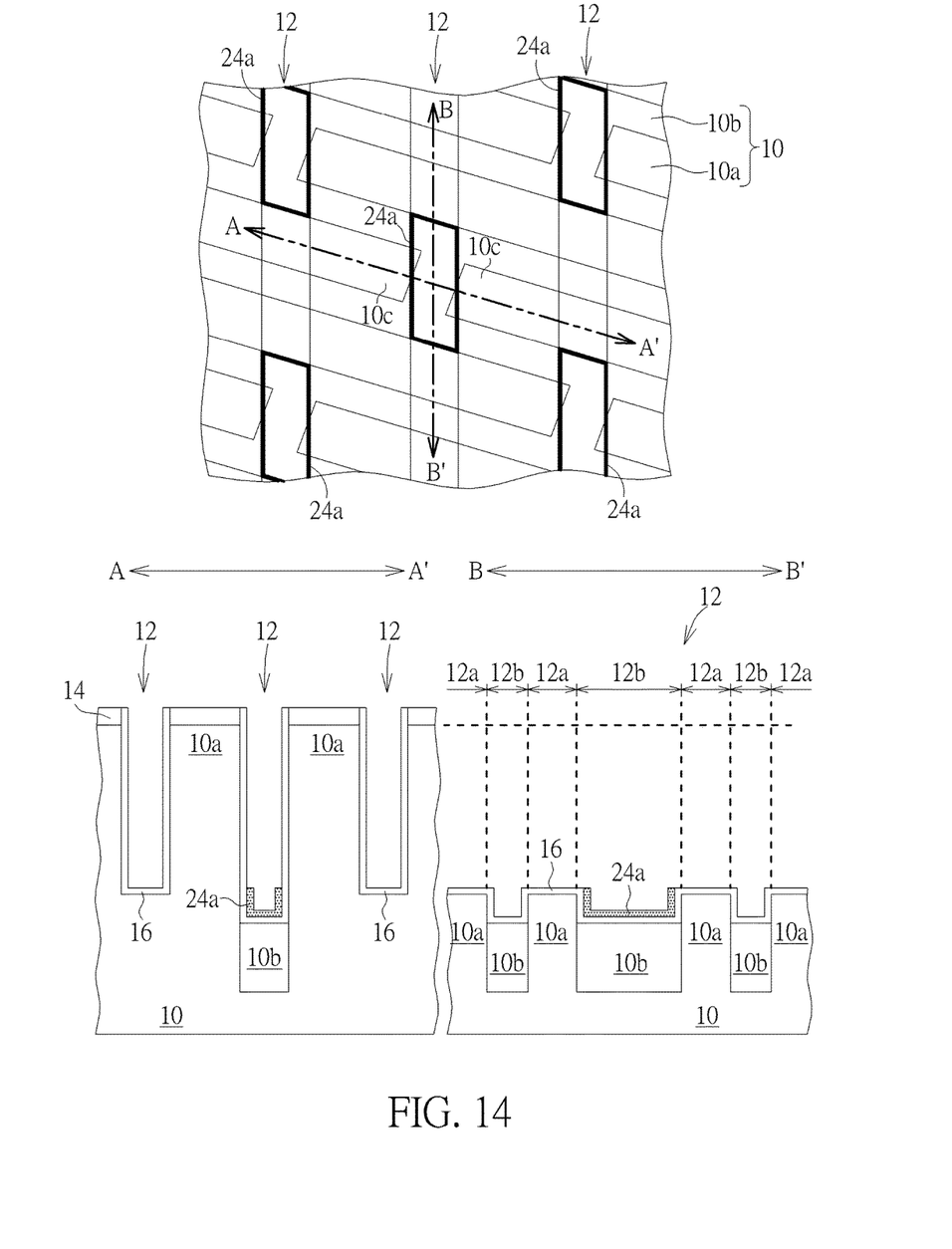

FIG. 12, FIG. 13 and FIG. 14 show a second modification of the preferred embodiment illustrated in FIG. 1 to FIG. 9 regarding the length of the openings 18a. The step shown in FIG. 12 corresponds to the step shown in FIG. 4. The step shown in FIG. 13 corresponds to the step shown in FIG. 5. The step shown in FIG. 14 corresponds to the step shown in FIG. 7. Other steps of the second modification are substantially the same as illustrated in previous passages. Please refer to FIG. 12. In the second modification, the openings (not shown) of the patterned mask may have a length along the first direction (along line A-A') equal to or larger than the distance between the active regions 10a intersected by the gate trench 12, and consequently the openings 18a formed in the gate trench 12 may also have a length larger than previously shown in FIG. 4. The openings 18a shown in FIG. 12 may expose the lengthwise sidewalls of the active regions 10a intersected by the gate trench 12. The segments 18a of the sacrificial layer 18 may have distal ends vertically aligned with the sidewalls of the active regions 10a or pulled back a little bit from the sidewalls of the active regions 10a. Please refer to FIG. 13 and FIG. 14. Similarly, the dielectric material 24 is then formed conformally covering the substrate 10, the sacrificial layer 18 and the openings 18a and is etched back until only remaining in a lower portion of each opening 18a and becoming the intervening structure 24a. After that, the sacrificial layer 18 is removed. It is noteworthy that, in the second modification, the intervening structure 24a overlaps the sidewalls of the terminals 10c in a lower portion of the gate trench 12, but also overlaps the sidewalls of the active region 10a intersected by the gate trench 12.

Figure 15:
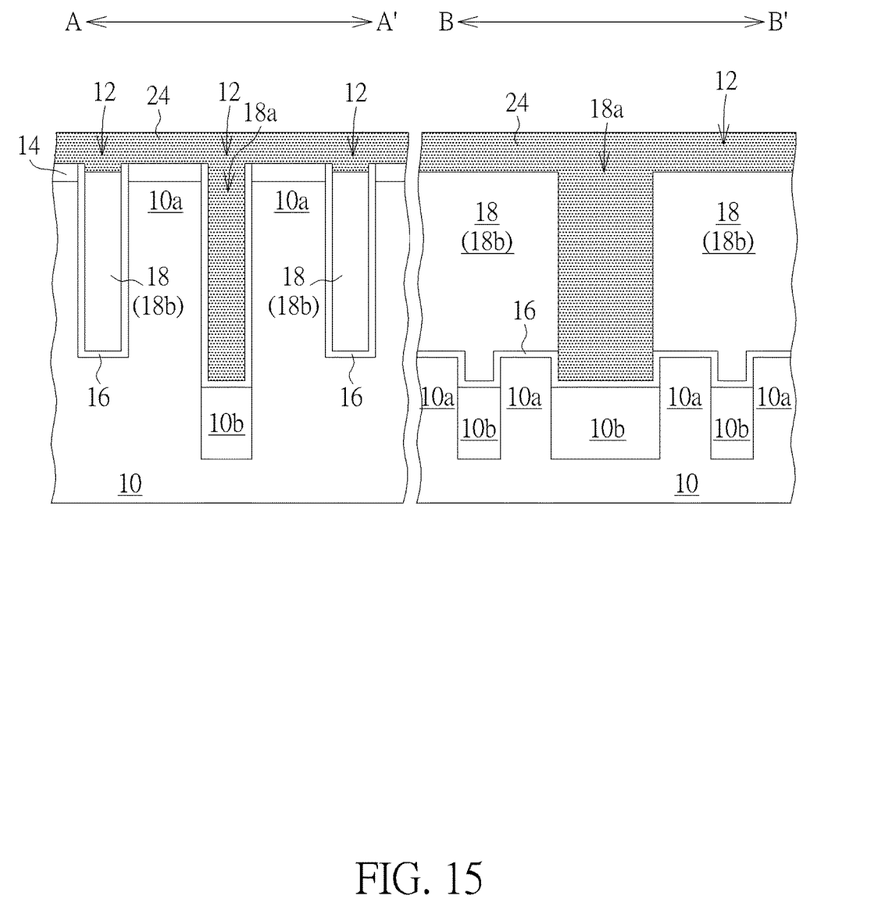
FIG. 15 to FIG. 16 are schematic diagrams illustrating a third modification of the preferred embodiment.
Figure 16:
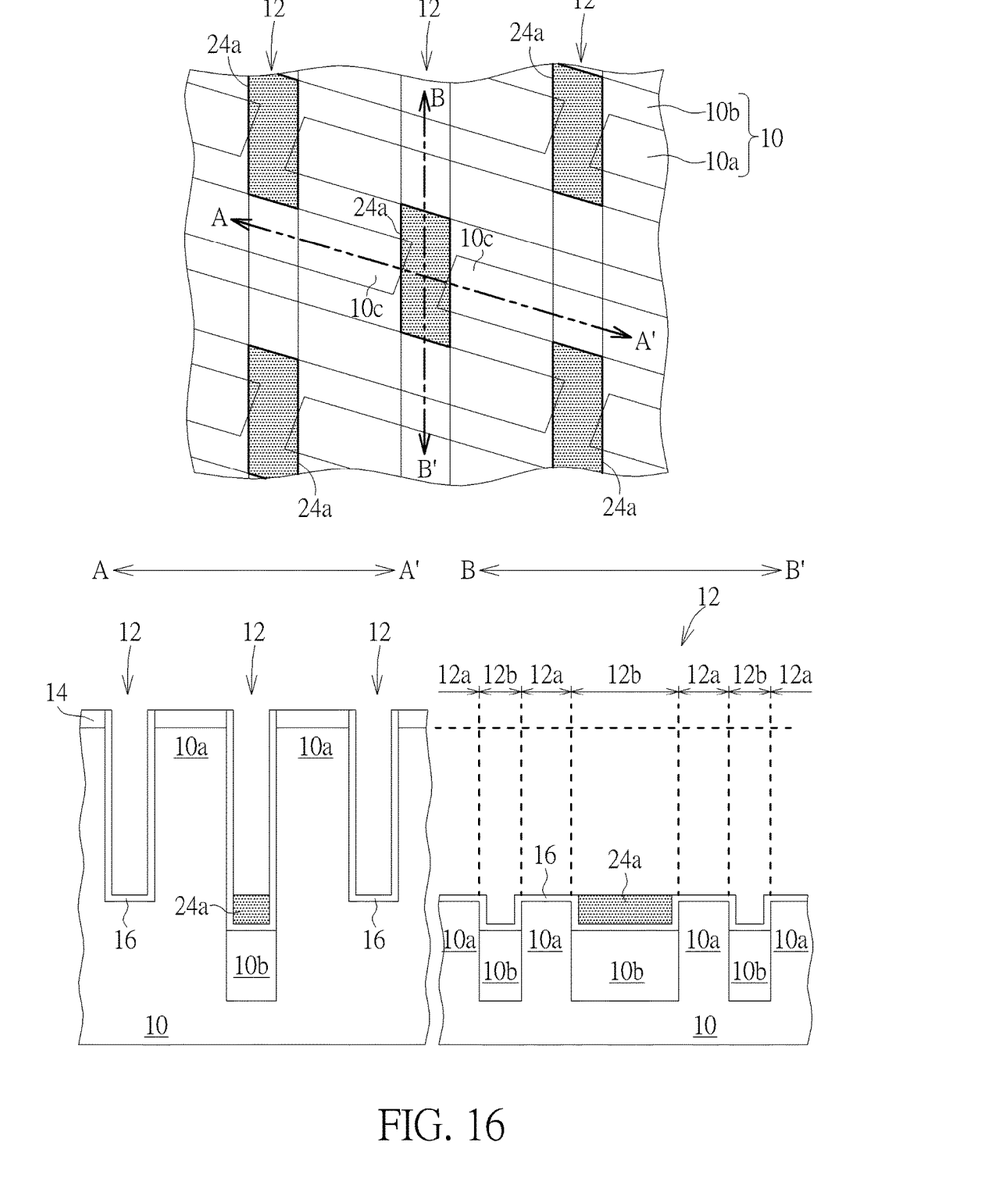

FIG. 15 and FIG. 16 show a third modification of the preferred embodiment illustrated in FIG. 1 to FIG. 9 regarding the length of the openings 18a and the way of the dielectric material 24 filling in the openings 18a. The step shown in FIG. 15 corresponds to the step shown in FIG. 5. The step shown in FIG. 16 corresponds to the step shown in FIG. 7. Other steps of the third modification are substantially the same as illustrated in previous passages. In the third modification, as shown in FIG. 15, the openings 18a not only expose the terminal sidewalls of the active regions 10a and the gate dielectric layer 16 covering thereon at two sides of the passing gate regions, but also extend lengthwise along the first direction (B-B') to expose the lengthwise sidewalls of the active regions 10a intersected by the gate trenches 12 and the gate dielectric layer 16 covering thereon at the other two sides of the passing gate regions. The dielectric material 24 is then formed completely filling the openings 18a. Please refer to FIG. 16. Afterward, the dielectric material 24 is recessed to a level only fill a lower portion of the openings 18a thereby forming multiple intervening structures 24a arranged along the first direction (B-B') in each gate trench 12. After that, the sacrificial layer 18 is completely removed and subsequent steps for forming the buried word lines (not shown in FIG. 16) are performed. In the third modification, preferably, the intervening structures 24a may fill up the bottom portions of the second regions 12b under the passing gate regions to level up or slightly higher than the bottom surfaces of the first regions 12a, thereby preventing the gate metal (not shown) of the buried word lines filling into those portions. Accordingly, the passing gate regions of the buried word lines may be formed at a level flush with or a slightly higher than adjacent active gate regions. In this way, the possibility of the parasitic electrons accumulating at a level lower than the active gate regions of the buried word lines which are more likely to bypass the active gate regions and drift to the bit line contacts may be eliminated.

It has been found that the accumulated parasitic electrons near the lower sidewall of the passing gate region dominate a significant part of the drifting electrons causing the row hammer effect. The semiconductor structure provided by the present invention may have eliminated row hammer effect by forming multiple dielectric intervening structures arranged along each gate trench and respectively disposed under each passing gate region of the buried word line formed in the gate trench. In one embodiment of the present invention, the intervening structure may increase the overall thickness of the dielectric layer sandwiched between the lower passing gate region and the active regions at two sides of the passing gate region, thereby reducing the parasitic capacitance near the lower sidewall of the passing gate region. Accordingly, the parasitic electrons accumulate near the lower sidewall of the passing gate region may be eliminated. In another embodiment of the present invention, the intervening structures may act as dielectric pedestals respectively padding under each passing gate region to elevate each passing gate region to a level at least flush with the active gate region of the buried word line. In this way, the parasitic electrons would not be able to accumulate at a level lower than the active gate region, and the opportunity for those parasitic electrons to bypass the active gate region of an un-selected word line and drift to the bit line contact may be effectively reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate having at least a gate trench extending along a first direction formed therein, wherein the gate trench comprises a plurality of first regions having a depth d1 and a plurality of second regions having a depth d2 arranged alternatingly along the first direction;
   a gate dielectric layer conformally covering the gate trench;
   a gate metal formed on the gate dielectric layer and partially filling the gate trench; and
   a plurality of intervening structures arranged separately along the first direction in a lower portion of the gate trench and disposed between the gate metal and the gate dielectric layer, wherein each of the intervening structures is disposed in one of the second regions.

2. The semiconductor structure according to claim 1, wherein each of the intervening structures has a cup shape.

3. The semiconductor structure according to claim 1, wherein each of the intervening structures has a solid pillar shape.

4. The semiconductor structure according to claim 1, wherein the depth d1 is smaller than the depth d2.

5. The semiconductor structure according to claim 1, wherein a height of the intervening structures is equal to or larger than a difference between the depth d2 and the depth d1.

6. The semiconductor structure according to claim 1, further comprising an isolation structure formed in the substrate and defining a plurality of active regions extending along a second direction.

7. The semiconductor structure according to claim 6, wherein the first region is where the gate trench intersects the active region, and the second region is where the gate trench intersect the isolation structure.

8. The semiconductor structure according to claim 6, wherein each of the intervening structures is between adjacent terminals of the active regions arranged along the second direction.

* * * * *